(12) United States Patent
Reisinger

(10) Patent No.: US 6,881,595 B2
(45) Date of Patent: Apr. 19, 2005

(54) METHOD OF AND APPARATUS FOR TESTING THE QUALITY OF PRINTED CIRCUITS

(76) Inventor: Werner Reisinger, Eichenstrasse 32, 93161 Sinzing (DE)

( * ) Notice: Subject to any disclaimer, the term of this patent is extended or adjusted under 35 U.S.C. 154(b) by 0 days.

(21) Appl. No.: 10/468,712
(22) PCT Filed: Feb. 20, 2002
(86) PCT No.: PCT/DE02/00610
§ 371 (c)(1), (2), (4) Date: Apr. 23, 2004
(87) PCT Pub. No.: WO02/067002
PCT Pub. Date: Aug. 29, 2002

(65) Prior Publication Data
US 2004/0164742 A1 Aug. 26, 2004

(30) Foreign Application Priority Data
Feb. 20, 2001 (DE) .......................... 101 08 550
Mar. 20, 2001 (DE) .......................... 101 13 523

(51) Int. Cl.[7] ............................................. H01L 21/66
(52) U.S. Cl. .................................................... 438/14
(58) Field of Search ................. 324/73.1; 250/252.1; 438/14

(56) References Cited

U.S. PATENT DOCUMENTS 5,157,255 A * 10/1992 Kornrumpf et al. ..... 250/252.1
5,440,566 A    8/1995 Spence et al.
6,107,107 A *  8/2000 Bruce et al. .................. 438/14
6,236,196 B1 * 5/2001 Guidotti et al. ............ 324/73.1
6,400,128 B1 * 6/2002 Guidotti et al. ............ 324/73.1

FOREIGN PATENT DOCUMENTS

DE    24 50 526 A    5/1975
EP    0 373 069 A    6/1990

OTHER PUBLICATIONS

Feldmann et al., "Herausforderung Qualität–Prüfstrategien im Wandel: Durchblick im optischen Test," *Die Fachzeitschrift für Elektronik–Ferigung und Test*, 1997, pp. 26–28, Heft 1/2.

* cited by examiner

*Primary Examiner*—John F. Niebling
*Assistant Examiner*—Andre' C. Stevenson
(74) *Attorney, Agent, or Firm*—Lowe Hauptman & Berner, LLP

(57) ABSTRACT

Electronic circuits or the parts thereof on printed circuit boards are tested by detecting infrared radiation emitted by the surface of the circuit. The detected radiation is converted to data that represent a surface structure and/or depth structure of the circuit. Deviation between the data representing the detected surface structure and/or depth structure and data representing the desired stated of the surface structure and/or depth structure are determined.

6 Claims, 1 Drawing Sheet

METHOD OF AND APPARATUS FOR TESTING THE QUALITY OF PRINTED CIRCUITS

FIELD OF INVENTION

The present invention relates to a method of and an apparatus for no-contact testing the quality of printed circuits.

For the quality control during the production and assembly of printed circuits, a mechanical method has been known which, using hundreds of contacts, by means of perforated masks as well as by means of contacts made of special alloys, scans a test specimen mechanically. For the quality test, individual circuits are contacted and their function is tested by an electric measuring adapter.

The electric testing by means of contacts and measuring adapters produced specifically for this purpose, however, requires high expenditures and is susceptible to disturbances. The positioning of the contacts in a measuring adapter is becoming increasingly difficult as a result of the miniaturization of the electronic modules. Since a separate special measuring adapter has to be constructed for each new type of printed circuit, the costs required for this purpose are enormous. This particularly applies to pilot series since, in this case, the next test series often results in changes to the layout and thus to the arrangement of the test contacts. Changes of the layout of the printed circuit therefore lead to expenses for changes on the electric measuring adapter or for its new construction. However, if for reasons of cost, a printed circuit is not tested, there is the risk of losing the saved costs many times over in the event of a faulty production.

A special test algorithm is used during the electric testing by means of the measuring adapter. If, for example, a narrowing of a track conductor occurs, this is acknowledged with the test result "fault-free"; that is, such production faults are not recognized. Parasitic lugs are also not detected, which may result in unusable products, particularly in the case of circuits for high-frequency applications. Likewise, non-centric drill holes are also not recognized as faults.

Another disadvantage of the previous testing method is the fact that the electric testing does not take place before the end of the production process, so that the fault can only be detected very late. The risk of producing a faulty series rises with the number of layers. Thus, in the case of an 8-layer multilayer printed circuit, the probability of a faulty production is much higher than in the case of a 2-layer printed circuit. Up to now, a multilayer printed circuit had to be completely produced in order to be able to determine that the first layer was faulty. Here, the above-described limitations with respect to the undetectable faults cannot be excluded anyway.

At the printed circuit manufacturers, the storage of electrical measuring adapters requires high logistical expenditures. It is not known which measuring adapters are needed when, where or if at all. Stored measuring adapters have to be found again. After an extended storage time, the contact may be in need of maintenance.

From German Patent Document DE 24 50 526 A1, a method is known for testing a body of a defined circuit construction, in which an infrared radiation of a circuit to be tested is recorded during an electric operation and is compared with an infrared radiation of a reference circuit in order to determine whether the circuit to be tested is operating in an electronically perfect manner. However, for this purpose, it is required that the circuit to be tested is already complete electrically and that bias voltages as well as test input signals are fed to the circuit to be tested. To this extent, this method essentially corresponds to the above-mentioned electric testing. A conversion of the detected infrared radiation into a depth structure does not take place. Correspondingly, the test may, for example, show that the circuit is operating in a perfect manner because the electric functions are at first carried out correctly, although a soldering point is defective, in which case this has an electrical effect on the operation of the circuit, for example, only after a mechanical or thermal stressing of the printed circuit or only in the case of certain input signals. This test can also only take place when the electric circuit is complete.

European Patent Document EP 0 373 069 A1 discloses a method for testing a printed circuit board which is equipped with components according to the surface-mounted technique, in which case the circuit to be tested is electrically activated and a thermographic image is taken when a thermal equilibrium has occurred. Deviations of the taken image from a reference image of the viewed component are determined. The electric activation of the printed circuit board optionally takes place statically; that is, the electric circuit on the printed circuit board is only connected with a supply voltage; or dynamically; that is, electric operations are carried out by means of the circuit to be tested. This method also essentially corresponds to the above-mentioned electric test. A conversion of the detected infrared radiation into a depth structure does not take place. Correspondingly, the above-mentioned faulty diagnoses may occur; that is, a defective soldering point, which has an effect only when it is mechanically stressed, is not detected.

U.S. Pat. No. 5,440,566 teaches a method for the thermographic testing of printed circuit boards in which an emission board is established in the thermal equilibrium, in which case a thermal image is corrected by means of the data of the emission board. The corrected data are analyzed in a neuronal network which emits a position of a faulty point.

It is an object of the invention to provide a method and a device for implementing the method which are improved with respect to the reliability and flexibility of the quality testing while the costs are simultaneously reduced.

SUMMARY OF THE INVENTION

According to one aspect of the invention, an electronic circuit or part thereof is tested by detecting infrared radiation by using a thermo-optical difference measurement step. The detected infrared radiation is converted to data which represent a depth structure of the circuit by analyzing the depth structure from a change of the infrared radiation over time at a certain location of the circuit. Deviations between the detected depth structure data and data representing the desired condition of the depth structure are determined.

The method has the advantage that, during an automated mechanical printed circuit production and assembly, assembling faults, as well as faults in the structure and measurement of the printed circuits themselves, can be detected with a high effectiveness and quality. As a result of the no-contact functionality, considerable cost reductions are achieved. Quality controls can be carried out rapidly and reliably. Costs and time are saved in comparison to conventional testing methods, in which case, as a result of an additionally high flexibility, the method can also be used economically in a small-scale production. The positioning of individual measuring testing devices is eliminated. A miniaturization required for adapting to the structures of the printed circuits to be tested is permitted at any time. A mechanical construction for individual test specimens is eliminated. The testing device becomes operative within a few seconds, whereby the testing costs are drastically reduced. In the event of changes of the layout of the printed circuits to be tested, only new data have to be read in in order to actualize the testing device. As a result, cost-effectively tested printed circuits are obtained also in the case of small quantities. The test result guaranties a virtually 100% faultlessness and provides a degree of quality which so far has not been reached. Smudgily etched track conductors as well as smudgy soldering points in the case of equipped printed circuits are detected as are non-centric drill holes or incorrectly milled dimensions of the printed circuit. Since the testing method according to the invention can be used in a rapid, simple and cost-effective manner between all production steps, faulty series productions can be excluded. As a result, a clear production advantage is achieved in the case of the expensive multilayer printed circuits. Because of the easy manageability of data, large quantities of different test specimens can be stored while the space requirement is low. Furthermore, the quality-related demands, for example, of aeronautical and space-flight engineering can be met. In addition, proof of quality regarding all production processes can be supplied for each individual product.

The detected data as well as the data of the desired condition are preferably data in digital form.

Expediently, the deviations are compared with corresponding tolerance bands and, as a function of this comparison, a "faultless" test result is generated when the deviations are within the tolerances band, or a "faulty" test result is generated when the deviations are at least partially outside the tolerance bands.

Conclusions concerning the structural situations in the depth can be drawn from corresponding changes of the temperature over the time in because the depth structure is analyzed from a change of the heat radiation over the time.

For carrying out a dynamic measurement, the circuit is heated or cooled during the measurement in Step (a).

For example, the detection in Step (a) is carried out by means of a thermo-optical difference measurement.

For a corresponding documentation concerning each printed circuit, the deviations of Step (b) are stored in a mass memory.

A test which can be implemented particularly rapidly is achieved in that the data of the desired condition are a layout of the circuit designed during the planning.

An apparatus for performing the above-mentioned method includes a converter for converting the detected infrared radiation to data which represent a depth structure of the circuit, and an arrangement for determining deviations between the data of the detected depth structure and the data of the desired condition of the depth structure.

The detected data as well as the data of the desired condition are preferably data in a digital form.

Expediently, a device is provided for comparing the deviations with corresponding tolerance bands.

To carry out the dynamic measurement, a device, particularly a laser, cools or heats the printed circuit during the measurement.

The device is constructed for carrying out a thermo-optical difference measurement.

To document the test results for each individual circuit, the the arrangement has a mass memory for storing the deviations.

In a particularly preferred embodiment, the sensor is at least one pyro sensor or a thermal image camera. As an alternative, the sensor comprises a laser.

A testing position which can be built up in a rapid, simple and cost-effective manner can be achieved in that the converter, and the arrangement for determining deviations are part of a computer. As a result, only the software and a database have to be adapted to the printed circuit to be tested in a concrete manner. A hardware adaptation of the testing device to the layout of the printed circuit is completely eliminated.

BRIEF DESCRIPTION OF THE DRAWING

The invention will be explained in detail in the following by means of the drawing. In the single FIGURE, this drawing shows a schematic block diagram of an embodiment of a device according to the invention for implementing the method according to the invention.

DETAILED DESCRIPTION OF THE DRAWING

Figure 1:
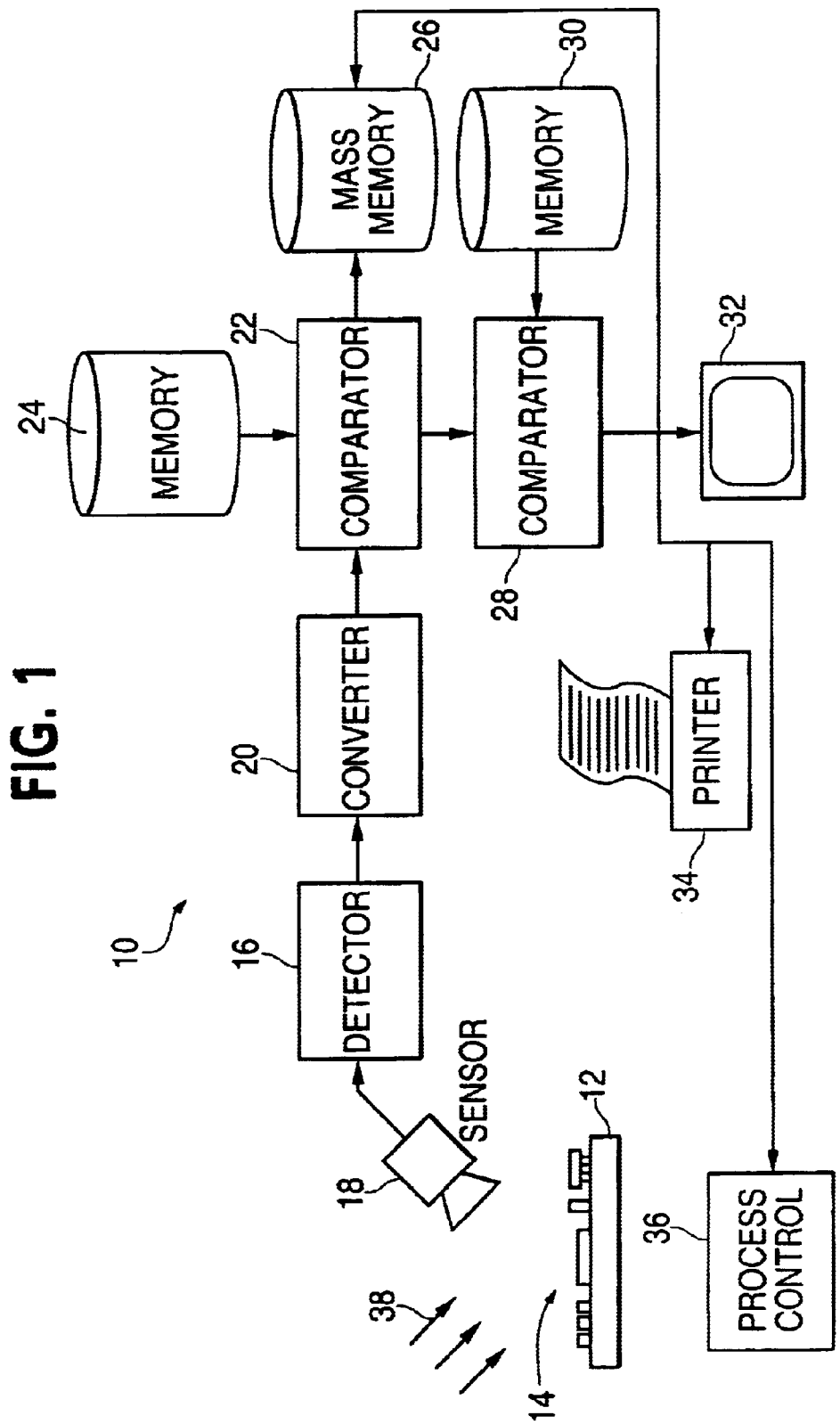

The embodiment of the device 10 illustrated in the figure for testing a circuit on printed circuit board 12 having a surface structure 14 comprises a detector 16 for detecting the infrared radiation of the printed circuit 12 in response to an output signal of a sensor 18, a converter 20 for converting the detected infrared radiation to digital data, a comparator 22 for comparing the digital data of the infrared radiation with digital data representing a desired condition of the depth structure stored in a memory 24 and for determining deviations between the digital data of the detected depth structure and the digital data of the desired condition of the depth structure from the memory 24. Signals indicative of these deviations are stored in a mass memory 26 and are supplied to a comparator 28 for comparing the deviations with corresponding tolerance bands which are filed in a memory 30. As a function of this comparison, the device generates the test result "fault-free" for the printed circuit 14 in response to the deviations being within the tolerance bands, or "faulty" in response to the deviations being at least partially outside the tolerance bands.

This test result is stored in the mass memory 26, is shown on a display device 32, is fed to a printer 34 which prints out a protocol on-line, as well as to a process control 36. The process control 36 sorts the printed circuit board 12, if required, automatically out of the production line when it receives the test result "faulty" from the comparator 28.

The sensor 18 is, for example, an optical sensor which receives electromagnetic waves 38 from the infrared range and feeds them to an image processing or image recognition device constructed in the detector 16.

Because of the simple and low-cost construction of the testing device 10, the latter, as required, is provided at several points in the production sequence for the printed circuit board 12. For example, during the production of a printed circuit board 12 with several layers, the depth structure 14 can be tested after each layer is produced.

The comparative data in the memory 24 are the data of the layout from the circuit design on the printed circuit board 12. Currently, this design is exclusively produced in a computer-aided manner, so that these layout data are present directly as digital data and, if required, have to be correspondingly converted only for the comparison in the device 22. In other words, a material structure 14 of the circuit on printed circuit board 12 is therefore queried in a no-contact manner by using the sensor 18 as the actual value and is compared with the desired value, specifically the layout data of the CAD design of the printed circuit. The tolerance bands in the memory 30 will then define permissible deviations of the actual values according to the detected depth structure from the desired values according to the data memory 24. If values leave the tolerance bands, the printed circuit board 12 is classified as faulty by the device 28 and can then immediately be pulled out of the running process. As required, the process control 36 provides a correction of process parameters in order to counteract a systematic fault on the printed circuits 12. If an intervention of operating personnel in the production sequence is necessary, the process control 36 stops the production and supplies a corresponding message. As a result, an undesirable and possibly cost-intensive production of rejects is effectively avoided.

It was found to be particularly advantageous that the method according to the invention and the device according to the invention respectively carry out the test in a no-contact manner. Since no mechanical contacts are required between the testing device 10 and the test specimen, specifically the printed circuit board 12, on the part of the testing device 10, no hardware adaptation to the layout of the printed circuit 12 has to be carried out. The only adaptation takes place on a software level, particularly in the case of the data in memories 24 and 30. The testing device 10 can be adapted to changes of the layout by simple clicking.

The printout from the printer 34 and the data in the memory 26 are used for documentation, in which case, it can easily be achieved that all test results can also still later be assigned to a certain printed circuit from different points in the production sequence. As a result, a complete testing protocol with the proof of a correct production can be added to the finished printed circuit. The data in the mass memory 26 have an unlimited storage time without special storage costs and, as required, can be made available worldwide via the Internet.

An interface between the sensor and the computer has to be established only once and is independent of the type and layout of the printed circuit.

During the thermo-optical difference measurement, thermal radiation originating from the surface of the printed circuit board 12 is detected by the sensor 18 and analyzed in the detector 16. In this case, conclusions can be drawn about the depth structure of the circuit on printed circuit board 12. For example, an analysis of the change of the thermal radiation over the surface of the printed circuit takes place, that is, of the different thermal radiation at different points on the printed circuit, which immediately indicates a depth structure. As an alternative or in addition, the printed circuit is heated and the change of the thermal radiation is determined at certain points; that is, in other words, a heating gradient is determined. For example, in this manner, feedthroughs in the printed circuit can be checked; that is, in the widest sense, the depth structure within the printed circuit can be checked. Because of the larger mass absorbing heat, a completely constructed feedthrough heats up more slowly than an incomplete feedthrough, so that the latter can be identified in a no-contact, simple and rapid manner. Instead of the measurement of the change of the thermal radiation over the time during the heating, and after the heating of the printed circuit, the change of the thermal radiation over the time during the cooling can be recorded. Here, for example, a complete feedthrough, because of the larger mass containing a larger amount of heat, cools more slowly than an incomplete feedthrough, so that the latter fault on the printed circuit 12 board can be determined in a simple, rapid, no-contact, non-destructive manner after the printed circuit 12 board has been completely fabricated.

What is claimed is:

1. Method for the no-contact testing of electronic circuits or parts thereof on a printed circuit, an infrared radiation being detected which originates from the surface of the printed circuit, characterized by (a) Detecting the infrared radiation by means of a thermo-optical difference measurement, (b) converting the detected infrared radiation to data which represent a depth structure of the printed circuit, in that a depth structure is analyzed from a change of the infrared radiation over the time at a certain point of the printed circuit, (c) comparing the data of the depth structure with stored data of a desired condition of the depth structure, and (d) determining deviations between the data of the detected depth structure and the data of the desired condition of the depth structure.

2. Method according to claim 1, characterized in that the data in Step (b) as well as the date of the desired condition in Step (c) are digital data.

3. Method according to claim 1 or 2, characterized in that, according to Step (d), the deviations are compared with corresponding tolerance bands and, as a function of this comparison, a "fault-free" test result is generated for the printed circuit if the deviations are within the tolerance bands, or a "faulty" test result is generated when the deviations are at least partially outside the tolerance bands.

4. Method according to claim 1, characterized in that the printed circuit is heated or cooled during the measurement in Step (a).

5. Method according to at least one of the preceding claims, characterized in that the deviations of Step (b) are stored in a mass memory.

6. Method according to at least one of the preceding claims, characterized in that the data of the desired condition of the depth structure are a layout of the printed circuit designed during the planning.

* * * * *